(12) United States Patent
Ohki et al.

(10) Patent No.: US 8,780,616 B2
(45) Date of Patent: Jul. 15, 2014

(54) MAGNETIC MEMORY SYSTEM AND METHODS IN VARIOUS MODES OF OPERATION

(75) Inventors: Thomas Akira Ohki, Arlington, MA (US); Andrew Kent, New York, NY (US)

(73) Assignees: Raytheon BBN Technologies Corp., Cambridge, MA (US); New York University, New York, NY (US)

( * ) Notice: Subject to any disclaimer, the term of this patent is extended or adjusted under 35 U.S.C. 154(b) by 100 days.

(21) Appl. No.: 13/477,970

(22) Filed: May 22, 2012

(65) Prior Publication Data

US 2012/0314490 A1    Dec. 13, 2012

Related U.S. Application Data

(60) Provisional application No. 61/496,455, filed on Jun. 13, 2011.

(51) Int. Cl.
*G11C 11/16*    (2006.01)
*G11C 11/02*    (2006.01)

(52) U.S. Cl.
CPC .............. *G11C 11/02* (2013.01); *G11C 11/16* (2013.01)
USPC .............. 365/158; 365/63; 365/160; 365/171

(58) Field of Classification Search
CPC .............. G11C 11/02; G11C 11/1673; G11C 11/16751; H01L 27/18; H01L 39/223
USPC .............. 365/158, 55, 63, 66, 160, 161, 162, 365/171, 173
See application file for complete search history.

(56) References Cited

U.S. PATENT DOCUMENTS

| | | | | |
|---|---|---|---|---|
| 3,936,809 A * | 2/1976 | Zappe | .......................... | 365/162 |
| 5,276,639 A | 1/1994 | Inoue | | |
| 6,154,044 A | 11/2000 | Herr | | |
| 7,224,601 B2 * | 5/2007 | Panchula | ...................... | 365/158 |
| 7,505,310 B2 * | 3/2009 | Nagasawa et al. | ............ | 365/160 |
| 8,208,288 B2 * | 6/2012 | Bulzacchelli et al. | ......... | 365/158 |
| 8,547,732 B2 * | 10/2013 | Bulzacchelli et al. | ......... | 365/158 |
| 2009/0244958 A1 | 10/2009 | Bulzacchelli et al. | | |

FOREIGN PATENT DOCUMENTS

KR    10-2010-0138037 A    12/2010

OTHER PUBLICATIONS

International Search Report mailed Dec. 12, 2012 in corresponding International Application No. PCT/US2012/039003.

* cited by examiner

*Primary Examiner* — Tan T. Nguyen
(74) *Attorney, Agent, or Firm* — Chapin IP Law, LLC

(57) ABSTRACT

A magnetic memory system includes a superconductor circuit and one or more magnetic memory elements to store data. To write data, a driver circuit in the superconductor circuit generates a magnetic signal for transmission over a superconductor link extending between the superconductor circuit and the magnetic memory element. To read data, a sensing circuit in the superconductor circuit monitors a superconductor link extending from sensing circuit to the magnetic memory element. The magnetic memory element can be a spin-transfer type magnetic memory element.

34 Claims, 7 Drawing Sheets

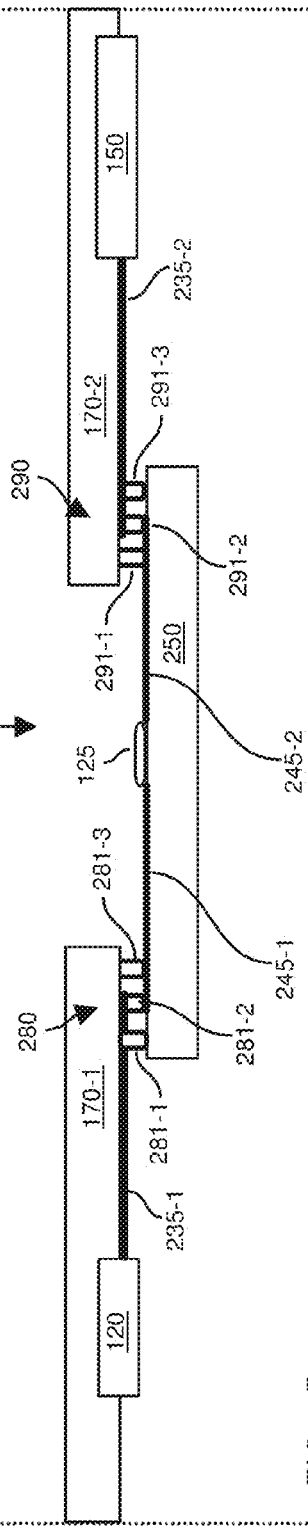
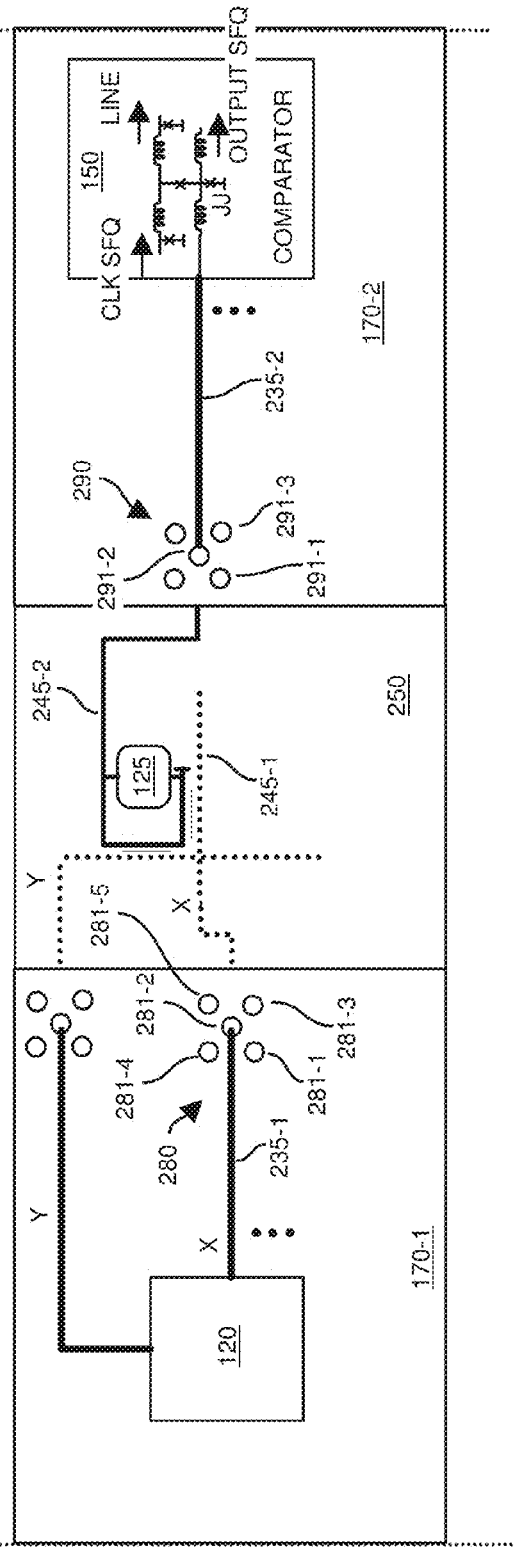
FIG. 2A
FIG. 2B

MAGNETIC MEMORY SYSTEM AND METHODS IN VARIOUS MODES OF OPERATION

RELATED APPLICATIONS

This application is related to and claims the benefit of earlier filed U.S. Provisional Patent Application Ser. No. 61/496,455 entitled "MAGNETIC MEMORY SYSTEM AND METHODS,", filed on Jun. 13, 2011, the entire teachings of which are incorporated herein by this reference.

GOVERNMENT RIGHTS

This invention was made with Government support under Award No. NSF-DMR-1006575 awarded by the National Science Foundation entitled "Spin Transfer in Magnetic Nanostructure" and Award No. ARO-W911NF-07-1-0643 by the US Army Research Office entitled "Electronics: Ultra-Fast Magnetoelectric Devices." The government may have certain rights in the invention.

BACKGROUND

Conventional magnetic RAM (Random Access Memory) stores data via magnetic memory elements as opposed to electric charge or current flows. Conventional magnetic memory elements are formed from multiple ferromagnetic layers. Each of the layers has a magnetization vector that can point in one of several directions, storing a magnetization state. A thin non-magnetic layer (e.g., a thin insulator layer or metal) typically separates the layers. If the non-magnetic layer is a metal the structure is known as a spin valve. It the non-magnetic layer is a thin insulating layer the structure is known as a magnetic tunnel junction. One of the two layers can be a permanent magnet set to a particular polarity; a field of the other layer can be changed to store data.

This configuration is the simplest structure for a MRAM bit. A typical magnetic memory device includes an array of memory "cells". Via an MRAM, a user can store substantial amounts of data. In a conventional MRAM cell magnetic fields generated by current carrying wires (i.e. an Amperian field) near the cells are used to reorient the magnetic field (or magnetization) in one of the layers to store data. This also known as field switched MRAM.

According to a newer conventional technique, Spin Transfer Torque (STT) or spin transfer switching, uses spin-aligned ("polarized") electrons to apply a torque directly to the magnetization of the layers. For example, if the electrons flowing into a layer have to change their spin direction, this develops a torque that will be transferred to the nearby layer. This significantly reduces an amount of current needed to write the cells from that of a conventional magnetic field switched MRAM cell.

There are concerns that the conventional type of MRAM cell will have difficulty at high cell densities due to the amount of current needed during writes, a problem that STT overcomes. For this reason, the STT proponents expect the technique to be used for smaller sized devices. For example, spin coherence may not be needed. The device needs to be smaller than the spin-diffusion length, which is around 100 nanometers or larger at low temperatures and which is easy to achieve. Overall, the STT requires much less write current than conventional or toggle MRAM. Research in this field indicates that STT current can be reduced by orders of magnitude by using a new composite structure. However, higher speed operation typically requires higher current.

So-called spin-torque transfer-RAM (STT-RAM) encodes non-volatile information in the relative alignment of the magnetizations of two magnetic layers—one fixed and one free. Magnetoresistance is a measure of the resistance of the magnetic device. A magnitude of the magnetoresistance depends on the relative alignment of the magnetization of two or more layers. One then can read the device by determining its resistance. As mentioned above, this is done in present day field switched MRAMs. STT-RAM differs from conventional MRAM by utilizing the torque exerted by an ensemble of spin-polarized electrons (or holes) to effect a rotation of the free layer through a short-range exchange interaction.

This conventional approach has allowed scaling of device size to much smaller dimensions than possible by the use of Amperian-field driven switching found in conventional MRAM. The spin-polarized current derives from all the magnetic layers in a device. The key point is that when one has magnetic layers and the current passes through these magnetic layers, the current acquires a spin-polarization.

BRIEF DESCRIPTION OF EMBODIMENTS

Conventional applications suffer from a number of deficiencies. For example, conventional applications as discussed above require substantial current to operate at higher speeds. Thus, conventional techniques can consume excessive energy and can be too slow for certain applications.

Embodiments herein deviate with respect to conventional techniques. For example, one embodiment herein is directed to a magnetic memory system providing high-speed access to magnetic memory elements.

More specifically, according to one embodiment, a magnetic memory system includes a superconductor circuit and one or more magnetic memory elements to store data. To access (e.g., read and/or write) data, the superconductor circuit generates a magnetic signal for transmission over a link between the superconductor circuit and the magnetic memory element.

In accordance with further embodiments, the magnetic memory element is a spin-torque magnetic memory element. By way of a non-limiting example, the superconductor circuit can be a single flux line driver; the magnetic signal can be a flux quantum signal.

In accordance with yet further embodiments, the superconductor circuit can be a single flux quantum comparator circuit. During operation, the single flux quantum comparator circuit monitors a state of the magnetic memory element to retrieve stored data. More specifically, by way of a non-limiting example, the single flux quantum comparator circuit can be used to detect a logic state of data stored in a respective magnetic memory element. In one embodiment, the single flux quantum comparator circuit is configured to sense a resistance change in the magnetic memory element to determine a logic state of the respective stored data.

As mentioned, the magnetic signal can be a flux quantum-based magnetic signal. The superconductor circuit can include one or more Josephson junctions to generate the quantum-based signal. By way of a non-limiting example, an amount of energy of the quantum-based signal to write the data to the magnetic memory element can be less than a threshold value of about $1 \times 10^{-19}$ Joules or any suitable value. By further way of a non-limiting example, an amount of energy of the quantum-based signal to read the stored data from the magnetic memory element can be less than about $1 \times 10^{-20}$ joules.

The magnetic memory element can include spin-polarizing material made of metal. For example, the magnetic memory element can include one or more spin-polarizing materials selected from the group consisting of: i) cobalt, ii) nickel, and iii) iron, (iv) alloys of these elements, such as NiFe, (Permalloy), CoFe, CoFeB (v) Co, Ni or Fe alloyed with nonmagnetic metal elements (e.g., Cu, Cr, B). This list is not necessarily exhaustive as other suitable materials any be used as well.

By further way of a non-limiting example, the link between the superconductor circuit and the magnetic memory element is an electrically conductive link on which to convey the magnetic signal from the superconductor circuit to the magnetic memory element. In one embodiment, the electrically conductive link includes one or more microstrip lines.

The microstrip line can be fabricated in one or more layers of a hybrid electronic semiconductor chip in which the superconductor circuit and the magnetic memory element are fabricated. Thus, the superconductor circuit and the magnetic memory element can be fabricated on the same substrate.

Embodiments herein can further include multiple semiconductor chips. For example, a superconductor circuit such as a single flux quantum driver circuit can be disposed on a first semiconductor chip. The first chip can include a microstrip line extending from the driver circuit to a first bump contact interconnect. The first bump contact interconnect further provides connectivity to a second semiconductor chip. The second semiconductor chip includes a microstrip line extending from the first bump interconnect and a magnetic memory element disposed on the second semiconductor chip. In this manner, the first bump contact interconnect provides connectivity of microstrip lines disposed on the first semiconductor chip and the second semiconductor chip.

Note that embodiments herein can further include a third semiconductor chip on which a sense circuit or detection circuit resides to read data from the magnetic memory element. The second bump contact interconnect provides connectivity between the second semiconductor chip and the third semiconductor chip. The third semiconductor chip includes a microstrip line extending from the second bump interconnect and the sense circuit on the second semiconductor chip.

Any of the one or more microstrip lines in the magnetic memory system as discussed herein can be superconductive. That is, the microstrip lines can be made of or include superconductive material to form superconductive microstrip links. Thus, any of the links as discussed herein can be a super-conductive link on which to convey a generated magnetic signal from the superconductor circuit to the magnetic memory element.

In further embodiments, the superconductor circuit includes a driver circuit such as a superconducting driver circuit to write data to magnetic memory elements. The superconductor circuit can also include a superconductor comparator circuit to read data stored in the magnetic memory elements.

An impedance of the magnetic memory element can be substantially matched to an output impedance of the superconductor circuit. In one embodiment, the impedances are between 2 and 25 ohms, although these settings can vary depending on the embodiment. The magnetic memory element can be a spin-valve comprising magnetic and non-magnetic metallic layers. The metallic layers facilitate impedance matching of the magnetic memory element to the superconducting driver or read circuitry. Current flows largely perpendicular to the layer planes. When the lateral scale of the device is less than about 100 nanometers, the impedance is in the range specified above.

In accordance with further embodiments, the magnetic memory element can be a spin-transfer device incorporating a magnetic polarizer with respect to a magnetic switchable layer in the magnetic memory element. The device may consist of several magnetic polarizing layers. In one example embodiment, at least one of the magnetic polarizing layers is orthogonal (largely perpendicularly) magnetized to the magnetic switchable layer.

Yet further embodiments include an environmental controller system to maintain a temperature of the superconductor circuit, the link, and the magnetic memory element below a threshold temperature to operate one or more components of the magnetic memory system in a super-conductive mode.

Yet further embodiments as discussed herein include receiving a request to retrieve data stored in a spin torque transfer magnetic memory element; in accordance with the request, utilizing a single flux quantum sense circuit to monitor a superconductive microstrip link extending to the magnetic memory element; and via the flux quantum sense circuit, detecting a state of the data stored in the spin torque transfer magnetic memory element.

These and other more specific embodiments are disclosed in more detail below.

As discussed herein, techniques herein are well suited for use in the field of storing data in a magnetic memory system. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

FIG. 2A is an example diagram illustrating a side view diagram of a magnetic memory system according to embodiments herein.

FIG. 2B is an example diagram illustrating a top view diagram of a magnetic memory system according to embodiments herein.

DETAILED DESCRIPTION

Figure 1:
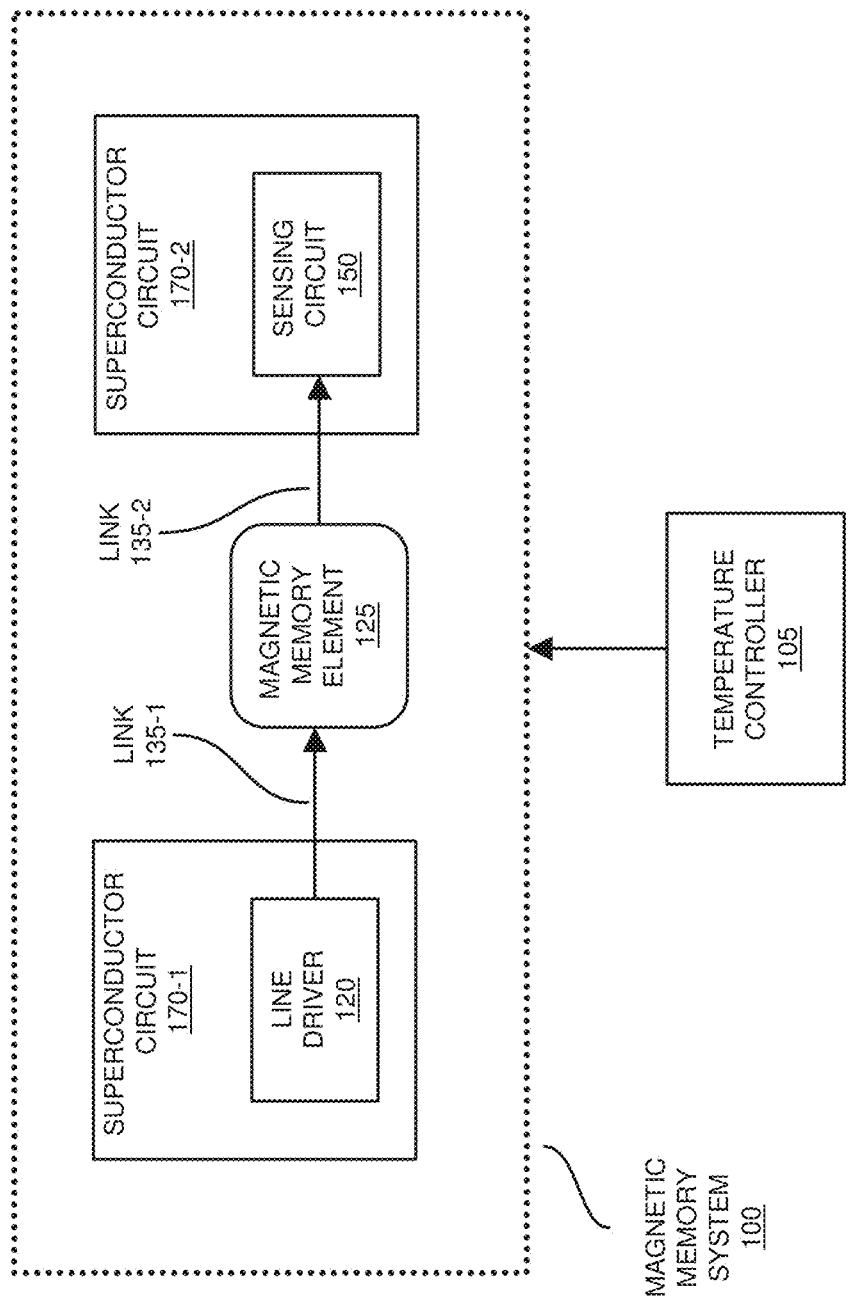
FIG. 1 is an example diagram illustrating a magnetic memory system and related components according to embodiments herein.

FIG. 1 is an example diagram illustrating a magnetic memory system and related components according to embodiments herein.

As shown, according to one embodiment, magnetic memory system 100 includes a superconductor circuit 170 (e.g., superconductor circuit 170-1 and superconductor circuit 170-2) and one or more magnetic memory elements 125 to store data.

By way of a non-limiting example, the superconductor circuit 170 can be any suitable of driving or sensing circuitry that generates a quantum of magnetic flux.

Temperature controller 105 maintains a temperature of the magnetic memory system 100 and corresponding components (e.g., superconductor circuit 170, the link, magnetic memory element 125) below a threshold temperature to operate one or more components of the magnetic memory system 100 in a super-conductive mode.

In one embodiment, the temperature controller 105 maintains the magnetic memory system 100 at a temperature below 10 degrees Kelvin, although a temperature setpoint of magnetic memory system 100 may vary depending on the type of superconductor material used to fabricate components in the magnetic memory system 100.

In general, to access data such as perform a write of data to the magnetic memory element 125, the line driver 120 in superconductor circuit 170-1 generates a magnetic signal for transmission over a respective link between the superconductor circuit 170 and the selected magnetic memory element 125.

The magnetic memory element 125 can be one of multiple magnetic memory elements in an array. In such an instance, the line driver 120 can include appropriate drive circuitry facilitating selection and access to each particular magnetic memory element in the array.

Note that the magnetic memory element 125 can be any suitable type of magnetic-based element to store data.

For example, in one embodiment, the magnetic memory element 125 is a spin-torque magnetic memory element.

In accordance with further embodiments, the magnetic memory element 125 can be a spin-transfer device incorporating a magnetic polarizer with respect to a magnetic switchable layer in the magnetic memory element. The spin-transfer device can incorporate a spin-valve, that is, two magnetic layers with magnetization vectors that can be either substantially parallel or antiparallel. An embodiment includes a magnetic polarizing layer than is largely magnetized perpendicularly to a switchable magnetic layer.

The magnetic memory element 125 can include spin-polarizing material made of metal. For example, the magnetic memory element can include one or more spin-polarizing materials selected from the group consisting of: i) cobalt, ii) nickel, and ii) iron, etc. This list is not intended to be exhaustive as other suitable materials any be used as well.

By way of further non-limiting example, the superconductor circuit 170 can be a magnetic flux quantum line driver; the magnetic signal generated by the line driver 120 to store data to the magnetic memory element 125 can be a magnetic flux quantum signal. In one embodiment, the superconductor circuit 170-1 is a single flux quantum line driver; the magnetic signal generated by the line driver 120 to store data to the magnetic memory element 125 can be a single flux quantum signal.

Superconductor circuit 170-2 includes a sensing circuit 150 to detect a setting of the magnetic memory element 125. In one embodiment, the magnetic memory element 125 stores digital information. That is, the data stored in magnetic memory element 125 can be a logic one or logic zero, although whether the magnetic memory element stores binary or other signal information can vary depending on the embodiment.

By way of further non-limiting example, the sensing circuit 150 used to detect a state of the magnetic memory element 125 can be a magnetic flux quantum comparator circuit. During operation, the sensing circuit 150 monitors a state of the selected magnetic memory element 125 in a respective array to retrieve stored data.

As mentioned, the magnetic signal produced by the line driver 120 can be a single flux quantum-based magnetic signal. The line driver 120 of superconductor circuit 170-1 can include one or more Josephson junctions to generate the quantum-based magnetic signal to write data to the magnetic memory element 125.

For example, by way of further non-limiting example, an amount of energy of the quantum-based magnetic signal produced by the line driver 120 to write the data to the magnetic memory element can be less than a threshold value of about $1 \times 10^{-19}$ Joules. Although note that an energy of the magnetic signal can be any suitable value, which varies depending on the embodiment.

The sensing circuit 150 of superconductor circuit 170-2 can include one or more Josephson junctions to facilitate reading of data stored in the selected magnetic memory element 125 in the array.

By further way of a non-limiting example, an amount of energy of the quantum-based signal to read the stored data from the magnetic memory element can be less than about $1 \times 10^{-20}$ Joules, although an energy of the magnetic signal to read data can be any suitable value that varies depending on the embodiment.

At least a portion of the links 135 (e.g., link 135-1 and/or link 135-2) between the line driver 120 and the magnetic memory element 125 can be physical. For example, the link 135-1 can be an electrically conductive link on which to convey a magnetic signal produced by the superconductor circuit to a selected magnetic memory element (i.e., magnetic memory element 125 in this example).

Each of the links 135 can be or include one microstrip line or multiple interconnected microstrip lines to provide connectivity between the line driver 120 and a selected magnetic memory element. In accordance with one embodiment, the links 135 can be fabricated of superconductive material to reduce power consumption and provide very fast access to the magnetic memory including magnetic memory element 125.

FIG. 2A is an example diagram illustrating a side view diagram of a magnetic memory system according to embodiments herein.

FIG. 2B is an example diagram illustrating a top view diagram of a magnetic memory system according to embodiments herein.

By way of a non-limiting example, the magnetic memory system 100 can be fabricated via use of multiple interconnected semiconductor chips. For example, superconductor circuit 170-1 can be a first semiconductor chip including line driver 120. Magnetic storage device 250 can be a second semiconductor chip including an array of magnetic memory elements to store data. Superconductor circuit 170-2 can be a third semiconductor chip enabling access to the magnetic memory elements in magnetic storage device 250.

Magnetic storage device 250 and/or magnetic memory element 125 can be a field switched magnitude memory or toggle type RAM (Random Access Memory) storage device. A toggle type magnetic memory element has a magnetic storage layer that switches between storage states when a write signal is applied. A write signal then always change the storage state such that multiple write signals are needed to return the magnetic storage layer to its original state. As discussed below, the magnetic storage device 250 can be a spin-transfer magnetic memory element.

Line driver 120 can be a magnetic flux quantum driver circuit disposed on the first semiconductor chip (i.e., superconductor circuit 170-1). In one embodiment, the line driver 120 generates multiple single flux quantum pulses to write data to a respective one or more magnetic memory elements.

As further shown, microstrip line 235-1 extends from the line driver 120 (i.e., a line driver circuit) to contact 281-2 of a bump contact interconnect 280. The contact 281-2 of bump contact interconnect 280 provides electrical connectivity of the microstrip line 235-1 to the X-axis microstrip line 245-1 in the magnetic storage device 250.

Note that, as shown, contact 281-2 may be substantially disposed in the center of multiple contacts 281-1, 281-3, 281-4, and 281-5. Center contact 281-2 carries a respective signal and is a signal line; surrounding contacts 281-1, 281-3, 281-4, and 281-5 can be tied to a signal such as ground.

In this example embodiment, the magnetic storage device 250 further includes a microstrip line 245-1 extending from the contact 281-2 to microstrip line 245-1. In other words, microstrip line 245-1 extends from the contact 281-2 to microstrip line 245-1.

Microstrip line 245-1 can extend from the contact 281-2 on an X-axis line passing by or directly contacting magnetic memory element 125.

A combination of microstrip line 235-1, contact 281-2, and microstrip line 245-1 represent link 135-1 between the line driver 120 and magnetic memory element 125 as shown and discussed in FIG. 1.

Referring again to FIG. 2, as shown, the magnetic memory system 100 can include complementary circuitry (e.g., substantially the same as the X-axis driver as discussed herein) to drive the Y-axis associated with magnetic memory element 125.

Proper timing of generating magnetic signals on the X-axis and Y-axis microstrip lines enables the line driver 120 to write data to the selected magnetic memory element 125.

Note that the magnetic memory system 100 can include any number of pairs of X-Y line drivers to write data to magnetic memory elements disposed in the magnetic storage device 250.

An output impedance of the line driver 120 in the superconductor circuit 170-1 driving the magnetic memory element 125 can be can be substantially matched to an impedance of the magnetic memory element 125. In one embodiment, the matched impedances are between 2 and 25 ohms, although the impedances can be any suitable value.

As a further example, the impedance of the magnetic memory element 125 may be a value of 7 ohms. In such an instance, impedance matching includes adjusting the output impedance of the line driver 120 to be substantially or approximately 7 ohms.

In accordance with another embodiment, the output impedance of the line driver may be 10 ohms. Impedance matching may include adjusting the impedance of the magnetic memory elements in the array to be substantially 10 ohms.

Thus, embodiments herein include a relatively low impedance magnetic memory element. Either or both of the impedance of the magnetic memory element 125 can be adjusted or the output impedance of the line driver can be adjusted to provide matching as discussed herein.

As mentioned, superconductor circuit 170-1 can be a semiconductor chip including line driver 120 and related circuitry disposed thereon. In this example embodiment, at least a portion of the link 135-1 is represented by microstrip line 235-1; at least a portion of link 135-2 is represented by microstrip line 235-2.

To facilitate high-speed accesses to a selected magnetic memory element such as selected magnetic memory element 125 in an array of magnetic memory elements disposed in magnetic storage device 250, the microstrip lines 235 (e.g., microstrip line 235-1, microstrip line 235-2, etc.) can be fabricated from superconductive material. That is, the microstrip lines 235 can be made of or include superconductive material to form superconductive microstrip links. Recall that the magnetic memory system 100 can be cooled below a threshold temperature value via temperature controller 105. Thus, any of the links 135 can be a very low impedance super-conductive link (e.g., substantially zero resistance) on which to convey the magnetic signal produced by line driver 120 to the selected magnetic memory element 125.

Use of superconductive microstrip lines is useful due to low power consumption and low pulse propagation delays. That is, the quantum signals on the microstrip lines travel at substantially the speed of light on a substantially zero impedance substrate.

As mentioned, embodiments herein can include a third semiconductor chip on which sensing circuit 150 resides to read data stored in magnetic memory elements of magnetic storage device 250. In accordance with such an embodiment, bump contact interconnect 290 provides connectivity between the second semiconductor chip (e.g., magnetic storage device 250) and a third semiconductor chip (e.g., superconductor circuit 170-2).

More specifically, magnetic storage device 250 includes a microstrip line 245-2 extending from selected magnetic memory element 125 to contact 291-2. The superconductor circuit 170-2 further includes a microstrip line 235-2 extending from the contact 291-2 of bump contact interconnect 290 to the sensing circuit 150.

In one embodiment, the sensing circuit 150 is a magnetic flux quantum comparator including one or more Josephson junctions facilitating a read of data from selected magnetic memory element 125.

The sensing circuit 150 can be a single flux quantum comparator.

As an alternative to the multi-chip solution including circuitry on each of multiple semiconductor chips interconnected via bump contact interconnects, note a single microstrip line can be fabricated in one or more layers of a hybrid electronic semiconductor chip on which the superconductor circuit 170-1, superconductor circuit 170-2, and array of magnetic memory elements all reside. That is, the superconductor circuits 170-1 and 170-2 and the magnetic memory storage device 250 can be fabricated on the same substrate. In such an embodiment, there is no need for the bump contact interconnects 280 and 290 since the circuitry associated with the superconductor circuits 170 and magnetic storage device 170 are disposed on a common facing.

Figure 3:
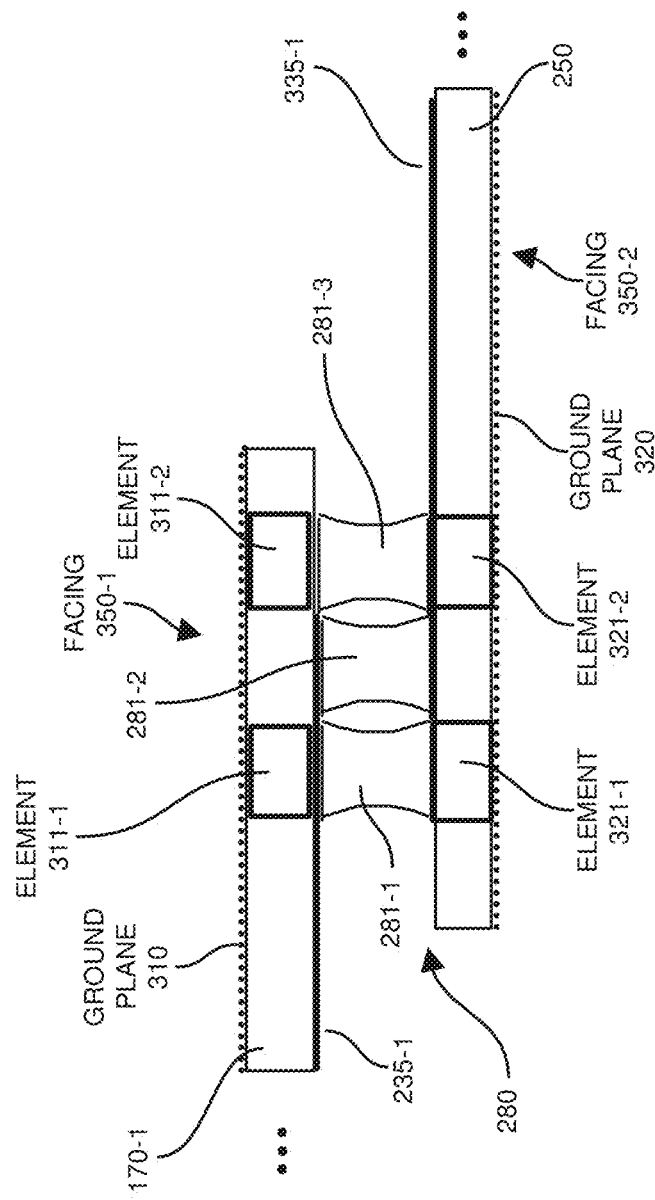
FIG. 3 is an example diagram illustrating a bump interconnect providing connectivity between circuitry disposed on multiple semiconductor chips according to embodiments herein.

FIG. 3 is a more detailed example side-view diagram illustrating a bump contact interconnect in which to provide connectivity between multiple semiconductor chips according to embodiments herein.

As previously discussed, bump contact interconnect 280 includes contacts 281-1, 281-2, 281-3, 281-4, and 281-5. Also, as previously discussed, contacts 281-1, 281-3, 281-4, and 281-5 are disposed around adjacent to center contact 281-2.

Each of contacts 281 is fabricated from a suitable superconductor material and is electrically conductive. Each of elements 311-1, 311-2, 321-1, and 321-2 is fabricated from a suitable superconductor material and is electrically conductive.

In this example embodiment as shown, superconductor circuit 170-1 includes ground plane 310 disposed on at least a portion of facing 350-1 of superconductor circuit 170-1. Magnetic storage device 250 includes ground plane 320 disposed at least on a portion of facing 350-2 of magnetic storage device 250.

A carrier material (e.g., non electrically conductive material) is disposed between the microstrip line 235-1 and the ground plane 310. In a similar manner, a carrier material (e.g., non electrically conductive material) is disposed between the microstrip line 335-1 and the ground plane 320.

Each of the contacts 281-1, 281-3, 281-4, and 281-5 provide at least a partial electrical path between ground plane 310 on facing 350-1 and ground plane 350-2 disposed on facing 350-2.

Each of elements 311-1, 311-2, 321-1, 321-2, etc., is also electrically conductive. Such elements 311-1, 311-2, etc. and elements 321-1, 321-2, also form part of a path providing electrical connectivity between ground plane 310 on facing 350-1 and ground plane 350-2 disposed on facing 350-2.

More specifically, as shown, a first terminal end of element 321-1 connects to ground plane 320 disposed on facing 350-2; a second terminal end of element 321-1 connects to contact 281-1. A first terminal end of element 311-1 connects to ground plane 310; a second terminal end of element 311-1 connects to contact 281-1.

The combination of element 321-1, contact 281-1, and element 311-1 form an electrically conductive path between ground plane 320 and ground plane 310.

In one embodiment, the combination of the components including element 311-1, contact 281-1, and element 321-1 is substantially columnar in shape.

Additionally, note that a first terminal end of element 321-2 connects to ground plane 320 disposed on facing 350-2; a second terminal end of element 321-2 connects to contact 281-3. A first terminal end of element 311-2 connects to ground plane 310; a second terminal end of element 311-2 connects to contact 281-3. Thus, the combination of element 321-2, contact 281-3, and element 311-2 form an electrically conductive path between ground plane 320 and ground plane 310. As discussed above, the combination of components can be columnar in shape.

In a similar manner, each of the other two contacts lying behind contact 281-1 and contact 281-3 forms part of a column-shaped connection between the ground plane 310 and the ground plane 320.

As previously discussed, the contact 281-2 carries the signal and provides connectivity of the terminal end of the microstrip line 235-1 to the terminal end of the microstrip line 335-1. The ends of the contact 281-2 do not extend to the ground planes 310 and 320.

By way of a non-limiting example, each bump contact interconnect 280 and 290 can be optimized to support operation at a desired frequency. For example, in one embodiment, each contact 281, 291, etc., can be approximately 30 to 60 micrometers wide and 1-2 micrometers in height. Note that these are only example values; the dimensions of the contacts, elements, microstrip lines, etc., can be any suitable values and vary depending on the embodiment.

Figure 4:
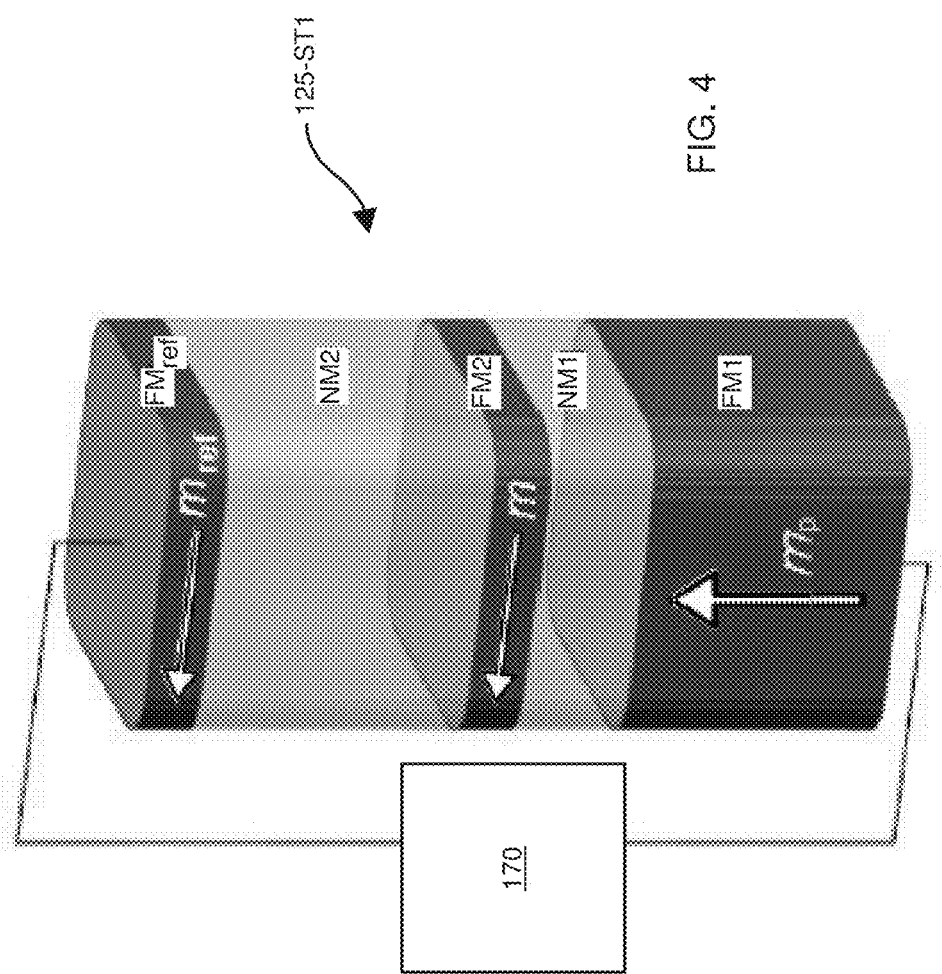
FIG. 4 is an example diagram illustrating magnetic memory element for use in the magnetic memory system according to embodiments herein.

FIG. 4 is a diagram illustrating an example of a magnetic memory element for possible use in the magnetic memory system according to embodiments herein.

In one embodiment, the magnetic memory element 125 is a spin-transfer magnetic memory element 125-ST1. The spin transfer magnetic memory element 125-ST1 includes three magnetic layers: a perpendicularly magnetized spin polarizing layer (FM1), a switchable magnetic layer (FM2), and a reference layer (FMref).

Both layer FM1 and layer FMref can be spin-polarizing layers. The logic state of the magnetic memory element depends on whether layer FM2 is magnetized largely parallel or antiparallel to the magnetization of the reference layer FMref. Layers NM1 and NM2 can be non-magnetic layers. Such layers can be made from metals or thin insulating layers (i.e. tunnel barriers).

To integrate the spin transfer magnetic memory element 125-ST1 with the superconductor circuitry 170—that is, for the spin transfer magnetic memory element 125-ST1 to have a sufficiently low impedance, the layers NM1 and NM2 can be made of metal. The spin transfer magnetic memory element 125-ST1 would then be a spin-valve. If the layer NM2 or layer NM1 is an insulator material, the spin transfer magnetic memory element 125-ST1 is denoted as a magnetic tunnel junction.

Figure 5:
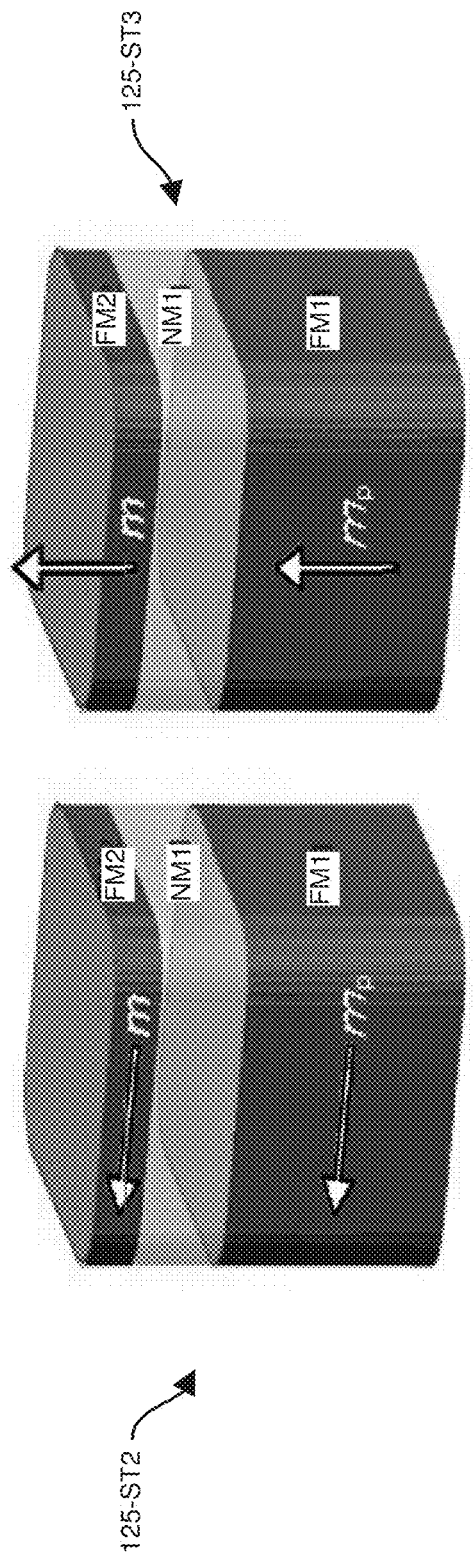
FIG. 5 is an example diagram illustrating additional spin transfer magnetic memory elements for possible use in the magnetic memory system according to embodiments herein.

FIG. 5 is an example diagram illustrating different types of spin transfer magnetic memory elements for possible use in an embodiment of the magnetic memory system as discussed herein.

As shown, each of the magnetic memory elements 125-ST2 and 125-ST3 (e.g., STT-RAM stacks with collinear magnetization) include two magnetic layers: layer FM1 and layer FM2.

In one embodiment, the layer FM2 is a switchable magnetic layer, the layer in which information is stored. The magnetization, m, of the free layer (i.e., layer FM2), and the polarizing magnetization, mp, of layer FM1, are separated by a non-magnetic layer NM1.

As shown, the spin transfer magnetic memory element 125-ST2 has an in-plane orientation; the spin transfer magnetic memory element 125-ST3 has a perpendicular orientation.

Further functionality supported by the different resources will now be discussed via flowcharts in FIGS. 6-7. Note that the steps in the flowcharts below can be executed in any suitable order.

Figure 6:
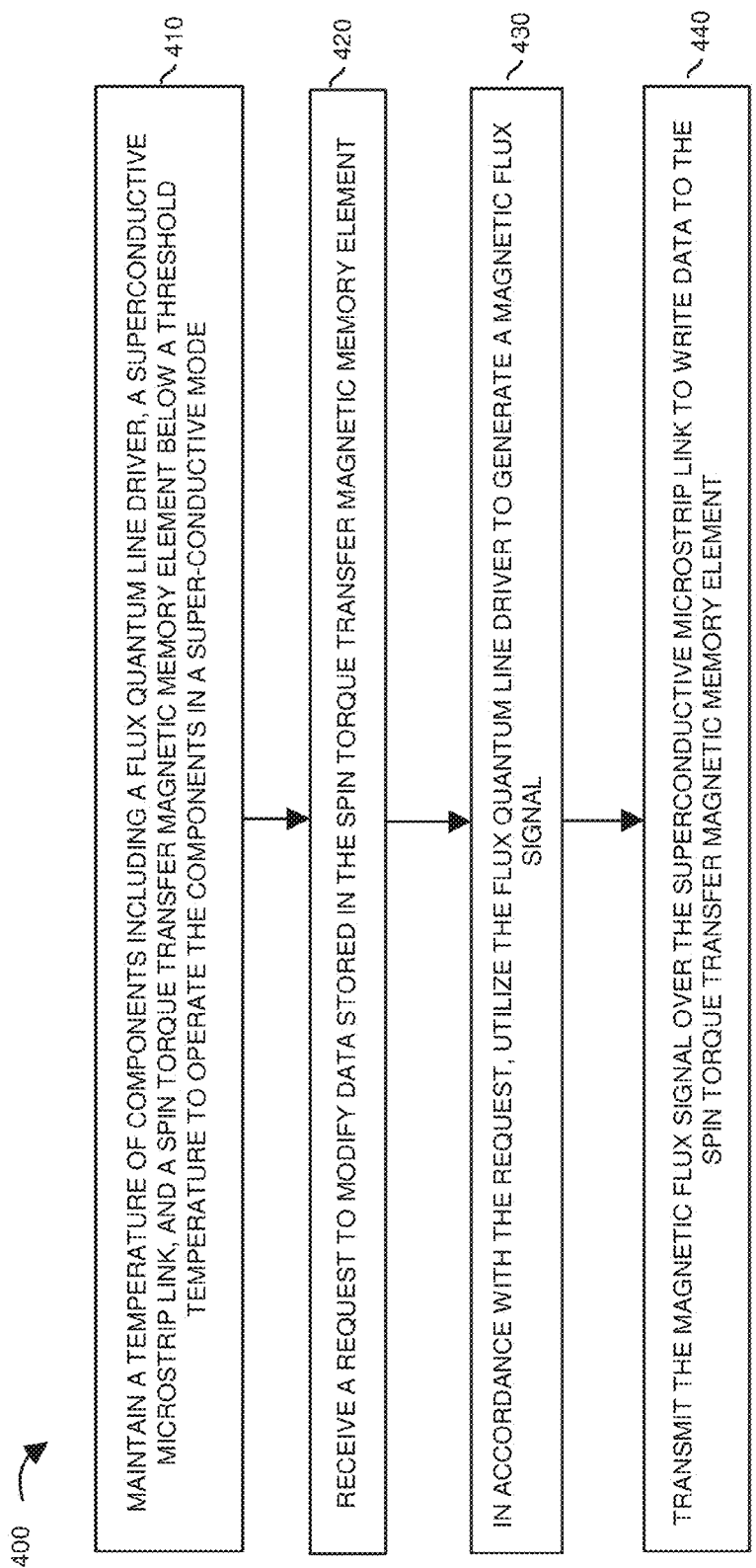
FIG. 6 is an example diagram of a flowchart illustrating writing of data to a magnetic memory element according to embodiments herein.

FIG. 6 is a flowchart 400 illustrating an example method of accessing a magnetic memory element according to embodiments. Note that there will be some overlap with respect to concepts as discussed above.

In step 410, the temperature controller 105 maintains a temperature of components including line driver 120, link 135-, and magnetic memory element 125 below a threshold temperature to operate one or more components of the magnetic memory system 100 in a super-conductive mode.

In step 420, the magnetic memory system 100 receives a request to modify data stored in the magnetic memory element 125.

In step 430, in accordance with the request, the magnetic memory system 100 utilizes line driver 120 to generate a magnetic flux signal.

In step 440, the magnetic memory system 100 transmits the magnetic flux signal over the link 135-1 to write data to the magnetic memory element 125.

Figure 7:
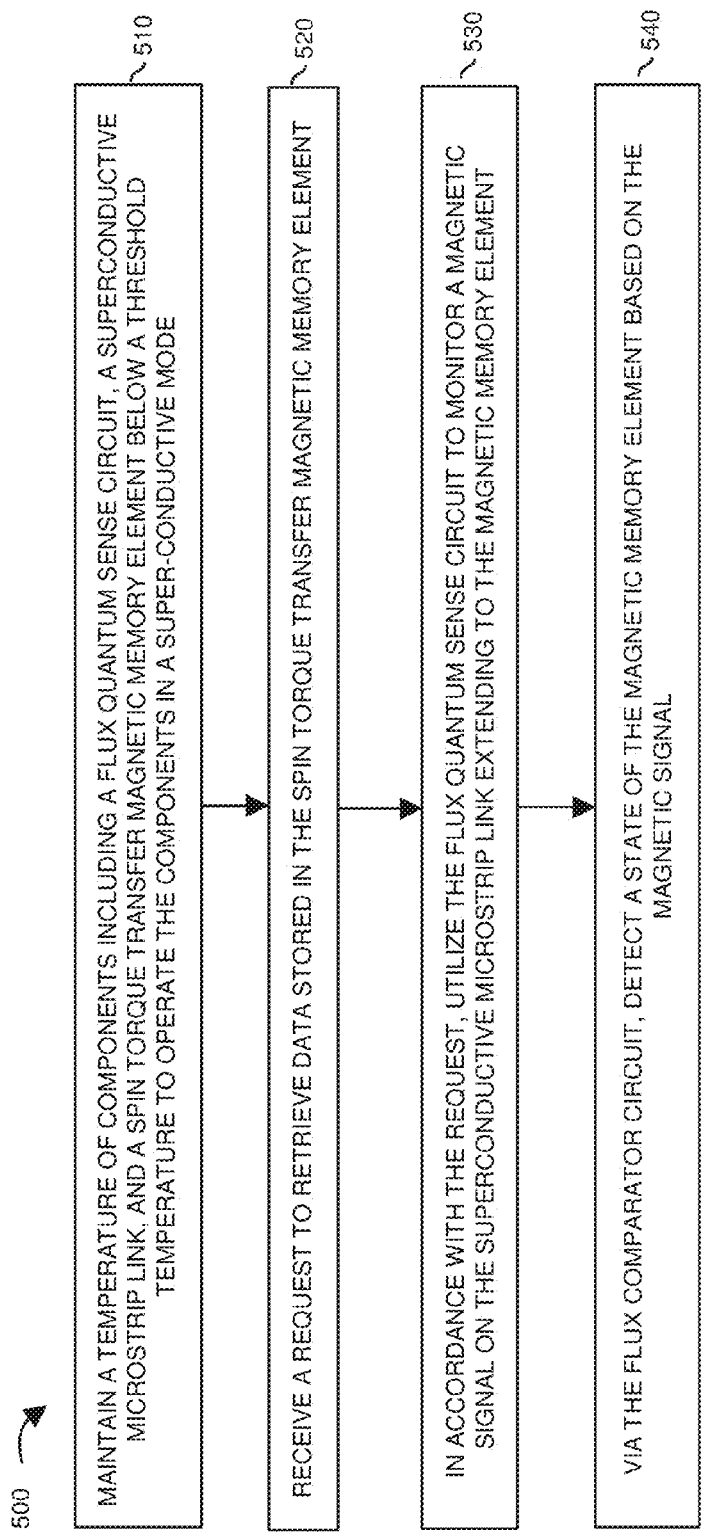
FIG. 7 is an example diagram of a flowchart illustrating reading of data stored in a magnetic memory element according to embodiments herein.

FIG. 7 is a flowchart 500 illustrating an example method according to embodiments. Note that there will be some overlap with respect to concepts as discussed above.

In step 510, the temperature controller 105 maintains a temperature of components including sensing circuit, link 135-2, and a magnetic memory element 125 below a threshold temperature to operate one or more components of the magnetic memory system 100 in a super-conductive mode.

In step 520, the magnetic memory system 100 receives a request to retrieve data stored in the magnetic memory element 125.

In step 530, in accordance with the request, the magnetic memory system 100 utilizes the sensing circuit 150 to monitor a magnetic signal on the link 135-2 extending to the magnetic memory element 125.

In step 540, via the sensing circuit 150 such as a flux comparator circuit, the magnetic memory system 100 detects a state of the magnetic memory element 125.

Note again that techniques herein are well suited for distributing content encoded at different levels of quality in a network environment. However, it should be noted that embodiments herein are not limited to use in such applications and that the techniques discussed herein are well suited for other applications as well.

While not shown in this example, those skilled in the art will understand that the computer system may include other processes and/or software and hardware components which have been left out of this illustration for ease of description of the invention.

Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

While the embodiments as discussed herein have been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. A system comprising:
   a superconductor circuit to generate a magnetic signal;
   a magnetic memory element to store data;
   a link between the superconductor circuit and the magnetic memory element; and
   the superconductor circuit transmitting the magnetic signal to the magnetic memory element over the link to access the magnetic memory element;
   wherein the link between the superconductor circuit and the magnetic memory element is an electrically conductive link on which to convey the magnetic signal from the superconductor circuit to the magnetic memory element;
   wherein the electrically conductive link is a microstrip line; and
   where the microstrip line is fabricated in at least one layer of a hybrid electronic semiconductor chip in which the superconductor circuit and the magnetic memory element are fabricated.

2. The system as in claim 1, wherein the magnetic memory element is a spin-torque magnetic memory element.

3. The system as in claim 1, wherein the superconductor circuit is a single flux quantum comparator circuit, the single flux quantum comparator circuit monitoring a state of the magnetic memory element to retrieve the data.

4. The system as in claim 1, wherein the magnetic signal is a quantum-based signal; and
   wherein the superconductor circuit includes at least one Josephson junction to generate the quantum-based signal.

5. The system as in claim 4, wherein an amount of energy of the quantum-based signal to write the data to the magnetic memory element is less than a threshold value of about $1 \times 10^{-19}$ Joules.

6. The system as in claim 4, wherein an amount of energy of the quantum-based signal to read the data from the magnetic memory element is less than about $1 \times 10^{-20}$ joules.

7. The system as in claim 1, wherein the magnetic memory element includes spin-polarizing material made of metal.

8. The system as in claim 1, wherein the magnetic memory element includes at least one spin-polarizing material selected from the group consisting of:
   i) cobalt
   ii) nickel,
   ii) iron.

9. The system as in claim 1, wherein the electrically conductive link is a super-conductive link on which to convey the magnetic signal from the superconductor circuit to the magnetic memory element.

10. The system as in claim 9, wherein the super-conductive link is a super-conductive microstrip link on which to convey the magnetic signal from the superconductor circuit to the magnetic memory element.

11. The system as in claim 1, wherein the superconductor circuit includes:
    a superconductor driver circuit to write the data to the magnetic memory element; and
    a superconductor comparator circuit to read the data from the magnetic memory element.

12. The system as in claim 1, wherein the magnetic memory element is a spin-transfer device incorporating a magnetic polarizer with respect to a magnetic switchable layer in the magnetic memory element.

13. The system as in claim 1 further comprising:
an environmental controller system to maintain a temperature of the superconductor circuit, the electrically conductive link, and the magnetic memory element below a threshold temperature to operate in a super-conductive mode.

14. The system as in claim 1, wherein the superconductor circuit is a single flux quantum line driver; and
wherein the magnetic signal is a single flux quantum signal.

15. The system as in claim 1, wherein an impedance of the magnetic memory element is substantially matched to an output impedance of the superconductor circuit.

16. A system comprising:
a superconductor circuit to generate a magnetic signal;
a magnetic memory element to store data;
a link between the superconductor circuit and the magnetic memory element;
the superconductor circuit transmitting the magnetic signal to the magnetic memory element over the link to access the magnetic memory element; and
wherein an impedance of the magnetic memory element is substantially matched to an output impedance of the superconductor circuit.

17. The system as in claim 16, wherein the superconductor circuit is a single flux quantum comparator circuit, the single flux quantum comparator circuit monitoring a state of the magnetic memory element to retrieve the data.

18. The system as in claim 16, wherein the link is a super-conductive link on which to convey the magnetic signal from the superconductor circuit to the magnetic memory element.

19. The system as in claim 18, wherein the super-conductive link is a super-conductive microstrip link on which to convey the magnetic signal from the superconductor circuit to the magnetic memory element.

20. The system as in claim 16, wherein the link is a microstrip link on which to convey the magnetic signal from the superconductor circuit to the magnetic memory element.

21. A method comprising:
receiving a request to access a magnetic memory element;
in accordance with the request, utilizing a superconductor circuit to generate a magnetic signal; and
transmitting the magnetic signal over an electrically conductive link to the magnetic memory element to access the magnetic memory element; and
wherein an output impedance of the superconductor circuit is substantially matched to an impedance of the magnetic memory element.

22. The method as in claim 21, wherein utilizing the superconductor circuit to generate the magnetic signal includes utilizing a single flux quantum line driver to generate a single flux quantum signal; and
wherein transmitting the magnetic signal over the electrically conductive link includes transmitting the single flux quantum signal over the electrically conductive link to access the magnetic memory element.

23. The method as in claim 21, wherein the superconductor circuit is a single flux quantum comparator circuit, the method further comprising:
utilizing the single flux quantum comparator circuit to detect a logic state of the magnetic memory element, the single flux quantum comparator circuit sensing a resistance change in the magnetic memory element.

24. The method as in claim 21, wherein the magnetic signal is a quantum-based signal; and
wherein utilizing the superconductor circuit includes implementing at least one Josephson junction to generate the quantum-based signal.

25. The method as in claim 21, wherein transmitting the magnetic signal over the electrically conductive link includes:
transmitting the magnetic signal from the superconductor circuit over a microstrip line to the magnetic memory element.

26. The method as in claim 25, wherein transmitting the magnetic signal over the electrically conductive link includes:
transmitting the magnetic signal from the superconductor circuit over a super-conductive microstrip line to the magnetic memory element.

27. The method as in claim 21 further comprising:
utilizing a magnetic polarizer in a magnetic switchable layer in the magnetic memory element.

28. The method as in claim 21 further comprising:
maintaining a temperature of components including the superconductor circuit, the electrically conductive link, and the magnetic memory element below a threshold temperature; and
operating the components in a super-conductive mode.

29. The method as in claim 21, wherein transmitting the magnetic signal over the electrically conductive link includes:
transmitting the magnetic signal from the superconductor circuit over a super-conductive link to the magnetic memory element.

30. A method comprising:
utilizing a superconductor circuit to generate a magnetic signal, the magnetic signal including data;
transmitting the magnetic signal over a conductive link to a magnetic memory element, the conductive link being a microstrip line, the microstrip line fabricated in a hybrid electronic semiconductor chip in which the superconductor circuit and the magnetic memory element are fabricated; and
storing the data in the magnetic memory element.

31. The method as in claim 30, wherein the magnetic signal is a single flux quantum signal, the method further comprising:
utilizing a single flux quantum line driver in the superconductor circuit to generate the single flux quantum signal; and
wherein transmitting the magnetic signal includes transmitting the single flux quantum signal over the microstrip line to store the data in the magnetic memory element.

32. The method as in claim 30 further comprising:
subsequent to storing the data in the magnetic memory element, utilizing a single flux quantum comparator circuit to detect a logic state of the magnetic memory element, the single flux quantum comparator circuit sensing a resistance change in the magnetic memory element to detect the logic state.

33. The method as in claim 30, wherein the microstrip line is a super-conductive microstrip line, the method further comprising:
transmitting the magnetic signal from the superconductor circuit over the super-conductive microstrip line to the magnetic memory element.

34. The method as in claim 30 further comprising:
  during an operation of transmitting the magnetic signal over the conductive link, maintaining a temperature of components including the superconductor circuit, the microstrip line, and the magnetic memory element below a threshold temperature.

\* \* \* \* \*